(12) United States Patent
Kwak

(10) Patent No.: US 6,256,245 B1
(45) Date of Patent: Jul. 3, 2001

(54) PRECHARGING APPARATUS AND METHOD IN A SEMICONDUCTOR MEMORY DEVICE

(75) Inventor: Jin Seok Kwak, Suwon (KR)

(73) Assignee: Samsung Electronics Co., LTD (KR)

( * ) Notice: Subject to any disclaimer, the term of this patent is extended or adjusted under 35 U.S.C. 154(b) by 0 days.

(21) Appl. No.: 09/634,058

(22) Filed: Aug. 9, 2000

(30) Foreign Application Priority Data

Feb. 3, 2000 (KR) ................................................ 2000-5310

(51) Int. Cl.[7] .................................................. G11C 7/00
(52) U.S. Cl. ........................ 365/203; 365/230.03; 365/63
(58) Field of Search ............................. 365/203, 230.03, 365/63, 190

(56) References Cited

U.S. PATENT DOCUMENTS

| | | | | |
|---|---|---|---|---|
| 5,781,495 | * | 7/1998 | Arimoto | 365/230.03 |
| 6,104,653 | * | 8/2000 | Proebsting | 365/203 |
| 6,151,269 | * | 11/2000 | Iosaka et al. | 365/230.03 |
| 6,175,532 | * | 1/2001 | Ooishi | 365/230.03 |
| 6,181,641 | * | 1/2001 | Lee et al. | 365/203 |

* cited by examiner

*Primary Examiner*—Tan T. Nguyen
(74) *Attorney, Agent, or Firm*—Mills & Onello LLP

(57) ABSTRACT

A precharging apparatus and method is applicable to a semiconductor device having a stack bank-type structure. The device comprises a plurality of memory cell array banks, a plurality of memory cell array blocks of each memory cell array bank comprising a predetermined number of partial blocks connected respectively to the predetermined number of groups of the plurality of partial local data input/output line pairs, in turn connected respectively to the predetermined number of groups of the plurality of global data input/output line pairs, a plurality of switching means which are connected respectively between the predetermined number of groups of the plurality of partial local data input/output line pairs and which are used to connect the predetermined number of groups of the plurality of partial local data input/output line pairs in response to a precharge signal, and a predetermined number of precharge means to precharge the predetermined number of groups of the plurality of partial local data input/output line pairs of each memory cell array block in response to the precharge signal. In this manner, the overall chip size can be reduced by reducing the number of transistors used during a precharge operation.

6 Claims, 6 Drawing Sheets

PRECHARGING APPARATUS AND METHOD IN A SEMICONDUCTOR MEMORY DEVICE

FIELD OF THE INVENTION

The present invention relates to a semiconductor memory device, and more particularly, to a semiconductor memory device and a precharge method thereof capable of reducing the overall chip size by reducing the number of precharge circuits required for precharging a local data input/output line pair.

DESCRIPTION OF THE BACKGROUND ART

The common arrangement of signal lines in semiconductor memory devices having a conventional "stack bank" structure consists of a word line and a local data input/output line pair arranged in the same direction, and a global data input/output line pair arranged perpendicular to the local data input/output line pair. The memory cell array of such a structure includes a plurality of memory cell array banks arranged in the direction of a word line, and a plurality of memory cell array blocks of each memory cell array bank also arranged in the direction of a word line. Each of the memory cell array blocks is partitioned into a predetermined number of separated partial blocks, each of the separated partial blocks being connected to each of the local data input/output line pairs, and each of the separated local data input/output line pairs being in turn connected to each of a plurality of global data input/output line pairs.

Thus, in the conventional stack-bank style semiconductor memory device, not only are the memory cell array blocks separated into a predetermined number of partial blocks, but also the local data input/output line pair of each partial block is likewise separated. Further, precharge circuits for precharging each of the local data input/output line pairs are necessary for each of the predetermined number of separated local data input/output line pairs.

Thus, the conventional stack-bank semiconductor memory device configuration results in a large overall chip size, due to the multiple precharge circuits required.

SUMMARY OF TIE INVENTION

It is an object of the present invention to provide a semiconductor memory device capable of reducing the chip size by reducing the number of precharge circuits required to precharge local data input/output line pairs in a stack bank structure.

It is another object of the present invention to provide a precharge method of a semiconductor memory device to accomplish the above object.

In one aspect, the present invention is directed to a semiconductor memory device semiconductor memory device comprising a plurality of memory cell array banks, each memory cell bank being partitioned into a plurality of memory cell array blocks, each memory cell array block comprising a predetermined number of partial blocks connected respectively to a predetermined number of groups of a plurality of partial local data input/output line pairs, the local data input/output line pairs being in turn connected respectively to a predetermined number of groups of a plurality of global data input/output line pairs. A plurality of switching means are connected respectively between the predetermined number of groups of the plurality of partial local data input/output line pairs, the switches being activated in response to a precharge signal for connecting the predetermined number of groups of the plurality of partial local data input/output line pairs. A predetermined number of precharge means precharge the predetermined number of groups of the plurality of partial local data input/output line pairs of each memory cell array block in response to the precharge signal.

In another aspect, the present invention is directed to a method of precharging a semiconductor memory device. First, a plurality of memory cell array banks are partitioned into a plurality of memory cell array blocks, each memory cell array block comprising a predetermined number of partial blocks connected respectively to a predetermined number of groups of a plurality of partial local data input/output line pairs, the local data input/output line pairs being in turn connected respectively to a predetermined number of groups of a plurality of global data input/output line pairs. The predetermined number of groups of the plurality of partial local data input/output line pairs are connected by a plurality of switching means, the switches being activated in response to a precharge signal for connecting the predetermined number of groups of the plurality of partial local data input/output line pairs. The predetermined number of groups of the plurality of partial local data input/output line pairs of each memory cell array block are precharged by a predetermined number of precharge means in response to the precharge signal.

In a first preferred embodiment of the apparatus and method, each of the plurality of switching means comprises a first NMOS transistor which is turned on in response to the above precharge signal.

In a second preferred embodiment, each of precharge means comprises second and a third NMOS transistors which are connected serially between said partial local data input/output line pairs, and which are turned on in response to said precharge signal; and a fourth NMOS transistor which is connected between said partial local data input/output line pairs, and which is turned on in response to said precharge signal.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

In the interest of a more thorough understanding of the present invention, a conventional "stack bank" structure semiconductor memory device and precharge method thereof will be described below with reference to the attached drawings.

Figure 1:
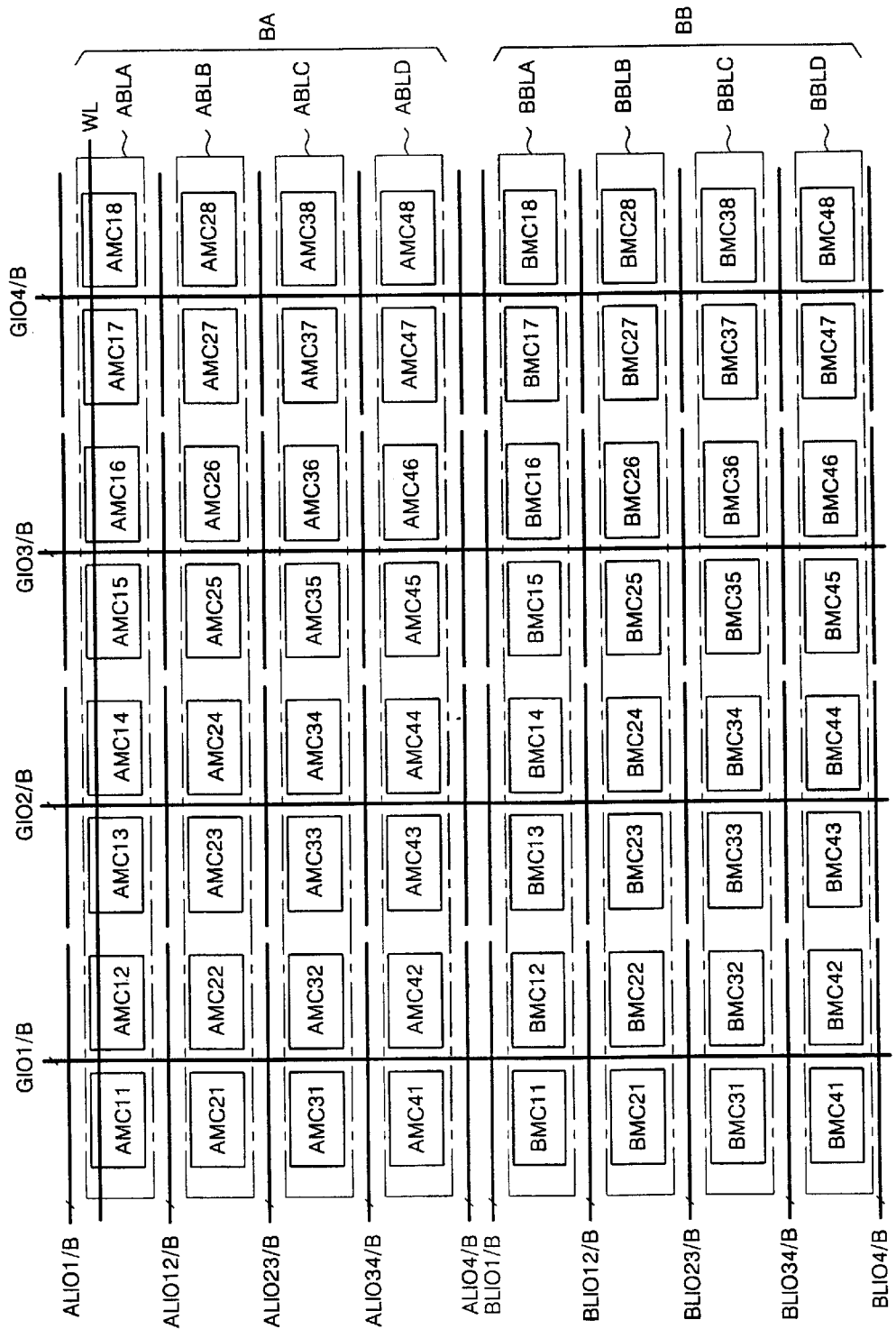
FIG. 1 is a block diagram illustrating an embodiment of a conventional semiconductor memory device having a stack bank structure.

FIG. 1 is a block diagram illustrating an embodiment of a conventional semiconductor memory device having a stack bank structure. The semiconductor memory device comprises two memory cell array banks BA and BB, each in turn comprising four memory cell array blocks ABLA, ABLB, ABLC, ABLD and BBLA, BBLB, BBLC, BBLD.

Each of four memory cell array blocks ABLA, ABLB, ABLC and ABLD comprises eight partial blocks AMCi1, AMCi2, AMCi3, AMCi4, AMCi5, AMCi6, AMCi7 and AMCi8, and i=1, 2, 3 and 4. Each of memory cell array blocks BBLA, BBLB, BBLC and BBLD comprises eight partial blocks BMCi1, BMCi2, BMCi3, BMCi4, BMCi5, BMCi6, BMCi7 and BMCi8, and i=1, 2, 3 and 4.

Each pair of partial blocks of eight partial blocks AMCi1, AMCi2, AMCi3, AMCi4, AMCi5, AMCi6, AMCi7 and AMCi8, and BMCi1, BMCi2, BMCi3, BMCi4, BMCi5, BMCi6, BMCi7 and BMCi8 (i=1, 2, 3, 4) of each of memory cell array blocks ABLA, ABLB, ABLC and ABLD, and BBLA, BBLB, BBLC and BBLD are arranged in the configuration of sharing one of the four groups of global data input/output line pairs GI01/B, GI02/3, GI03/B and GI04/B.

Ten groups of local data input/output line pairs ALI01/B, ALI012/B, ALI023/B, ALI034/B, ALI04/B, BLI01/B, BLI012/B, BLI023/B, BLI034/B and BLI04/B are arranged between memory cell array blocks ABLA, ABLB, ABLC, ABLD, BBLA, BBLB, BBLC and BBLD. Each of the six pairs of local data input/output lines ALI012/B, ALI023/B, ALI034/B, BLI012/B, BLI023/B and BLI034/B is a line pair shared by adjacent upper and lower memory cell array blocks.

Each of the ten groups of local data input/output line pairs ALI01/B, ALI012/B, ALI023/B, ALI034/B, ALI04/B, BLI01/B, BLI012/B, BLI023/B, BLI034/B and BLI04/B comprises four groups of partial local data input/output line pairs which are disconnected in units of two partial blocks. That is, the conventional stack bank structure is configured such that each memory cell array block is separated into a predetermined number of partial blocks, while local data input/output line pairs of each separated partial block are connected to respective, corresponding global data input/output line pairs.

Figure 2:
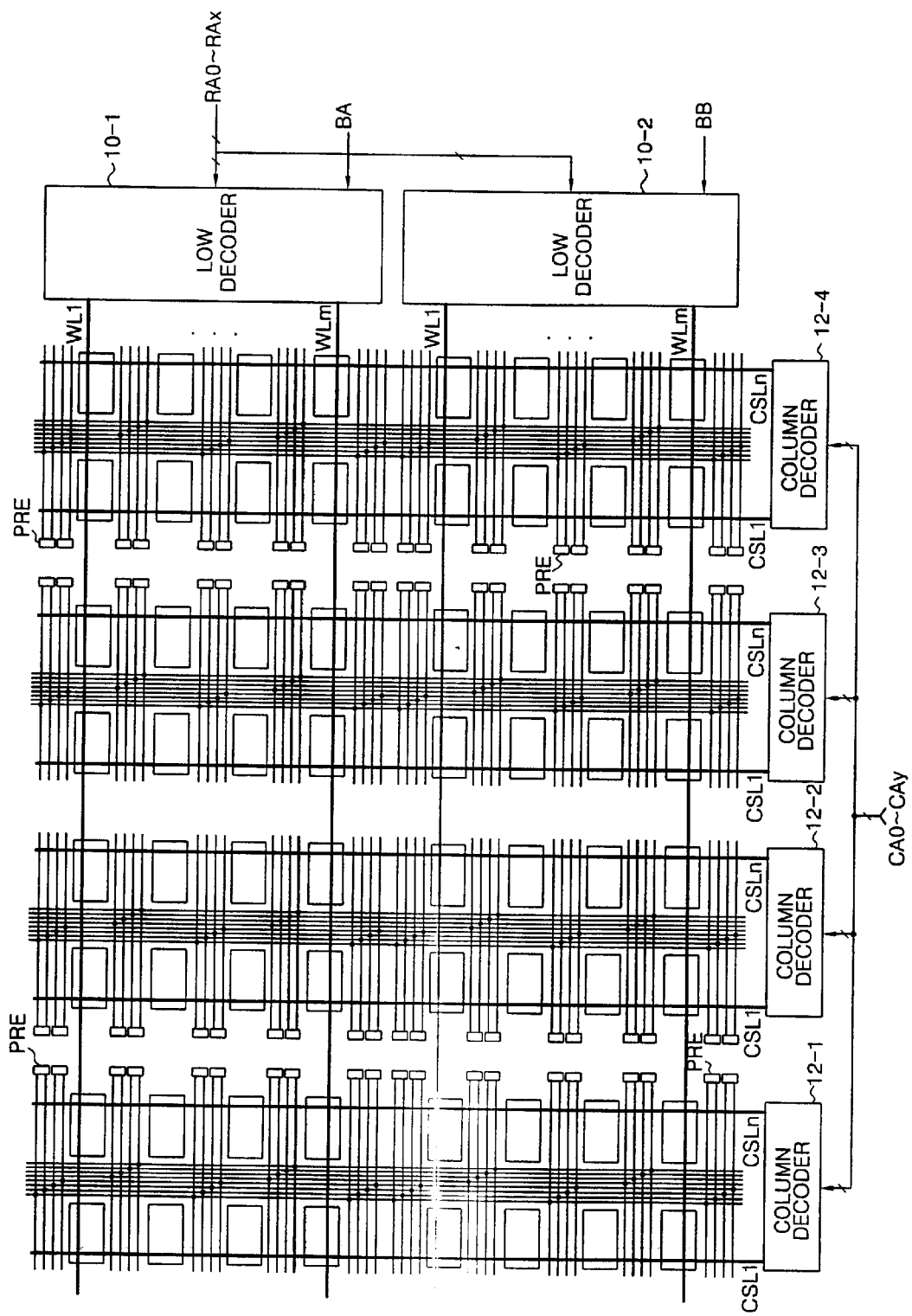
FIG. 2 is a close-up block diagram of the conventional semiconductor memory device shown in FIG. 1.

FIG. 2 is a detailed block diagram of the conventional configuration of FIG. 1. In FIG. 2, precharge circuits PRE, row decoders 10-1 and 10-2, and column decoders 12-1, 12-2, 12-3 and 124 are added to the illustration of the FIG. 1 block diagram. Each of four groups of global data input/output line pairs GI01/B, GI02/B, GI03/B and GI04/B is configured in 4 pairs, and each of ten groups of local data input/output line pairs ALI01/B, ALI012/B, ALI023/B, ALI034/B, ALI04/B, BLI01/B, BLI012/B, BLI023/B, BLI034/B and BLI04/B is configured in 2 pairs. Symbols shown in the block diagram of FIG. 2 are equivalent to like symbols shown in the block diagram of FIG. 1, and bank selection signals of each of banks BA and BB are shown as BA and BB.

The function of additional blocks of FIG. 2 is as follows. Each of row decoders 101, 10-2 generates m word line selection signals WL1, . . . , WLm by decoding row address RA0-RAx in response to each of the bank selection signals BA and BB. Each of column decoders 12-1, 12-2, 12-3 and 124 generates n column selection signals CSL1, . . . , CSLn by decoding column address CA0-CAy.

Precharge circuits PRE are connected to each of four groups of partial local data input/output line pairs of each often groups of local data input/output line pairs ALI01/B, ALI012/B, ALI023/B, ALI034/B, ALI04/B, BLI01/B, BLI012/H, BLI023/B, BLI034/B and BLI04/B.

The conventional local data input/output line precharge operation of a semiconductor memory device having a stack bank structure as shown in FIG. 2 is as follows. Ten groups of local data input/output line pairs ALI01/B, ALI012/B, ALI023/B, ALI034/B, ALI04/B, BLI01/B, BLI012/B, BLI023/B, BLI034/B and BLI04/B are precharged by enabling precharge circuits PRE of memory cell array blocks ABLA, ABLB, ABLC, ABLD, BBLA, BBLB, BBLC and BBLD before a row address strobe signal is activated. A bank selection signal and a block selection signal to activate a memory cell array bank BA and a memory cell array block ABLA in bank BA are generated by activating a row address strobe signal of the bank BA.

When a column address strobe signal is activated, the precharge operation of local data input/output line pairs ALI01/B and ALI012/B is complete. If column address signals are activated in response to a column address, during a read operation, data read from a memory cell array block ABLA is transmitted to two groups of local data input/output line pairs ALI01/B and ALI012/B, and during a write operation, data is transmitted to two groups of local data input/output line pairs from four groups of four global data input/output line pairs GI01/B, GI02/B, GI03/B and GI04/B, and is transmitted to memory cell array block ABLA. Precharge circuits PRE of other memory cell array blocks ABLB, ABLC, ABLD, BBLA, BBLB, BBLC and BBLD maintain the enable operation and precharge local data input/output line pairs ALI023/B, ALI034/B, ALI04/B, BLI01/B, BLI012/B, BLI023/B, BLI034/B and BLI04/B.

Figure 3:
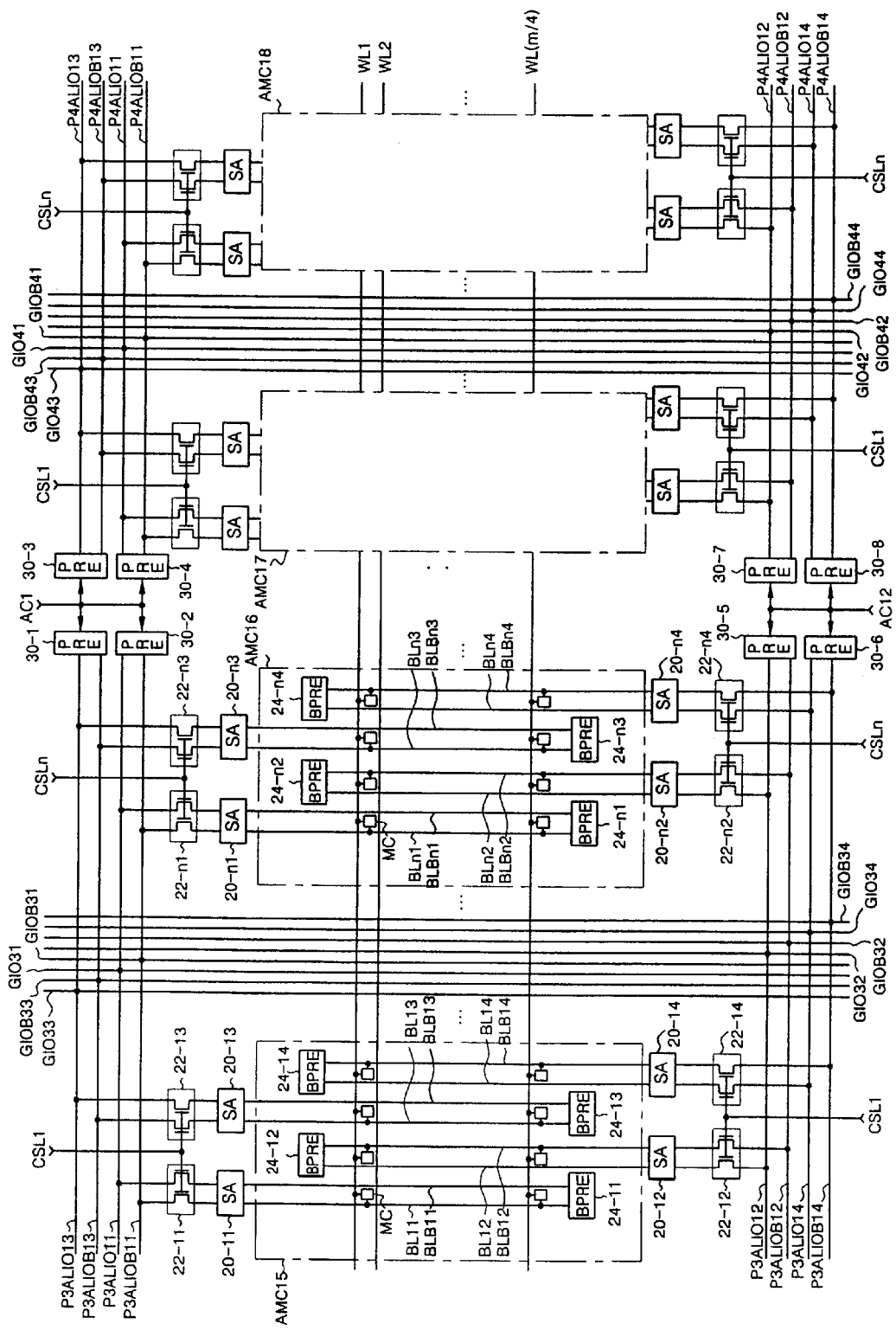
FIG. 3 is a close-up block diagram of the partial memory blocks of the memory cell array shown in FIG. 2.

FIG. 3 is a detailed block diagram of partial blocks AMC15, AMC16, AMC17, AMC18 of the memory cell array shown in FIGS. 1 and 2. In FIG. 3, partial blocks AMC15 and AMC16 are arranged to the right and left of four global data input/output line pairs GI031/B, GI032/B, GI033/B and GI034/B, and partial blocks AMC17 and AMC18 are arranged in the right and left of four global data input/output line pairs GI041/B, GI042/B, GI043/B and GI044/B.

Two pairs of partial local data input/output lines P3ALI011/B, P3ALI013/B, P3ALI012/B and P3ALI0B14/B, and P4AI011/B, P4ALI013/B, P4ALI042/B and P4ALI044/B are arranged above and below partial blocks AMC15 and AMC16, and AMC17 and AMC18.

In FIG. 3, sense amplifiers, bit line precharge circuits and local data input/output line precharge circuits are designated as SA, BPRE, and PRE, respectively. The configuration and the symbol of internal circuit blocks of partial blocks AMC17 and AMC18 are equivalent to those of partial blocks AMC15 and AMC16.

The function of partial blocks AMC15 and AMC16 and their peripheral block is as follows. Memory cells MC are connected respectively between m/4 word lines WL1, WL2, . . . , WL and four bit line pairs BL11 and BLB11, BL12 and BLB12, BL13 and BLB13, BL14 and BLB14, . . . , BLn1 and BLBn1, BLn2 and BLBn2, BLn3 and BLBn3, BLn4 and BLBn4 of n groups. Four bit line precharge circuits 24-11, 24-12, 24-13, 24-14, . . . , 24-n1, 24-n2, 24-n3, 24-n4 of n groups, precharge bit line pairs, being connected between four bit line pairs of n groups. Four column selection gates 22-11, 22-12, 22-13, 22-14, . . . , 22-n1, 22-n2, 22-n3, 22-n4 of n groups interconnect partial local data input/output line pairs P3ALI011/B, P3ALI013/B, P3ALI012/B, P3ALI0B14/B and four bit line pairs in response to each of n column selection signals CSL1, ..., CSLn. Four bit line sense amplifiers 22-11, 22-12, 22-13, 22-14, ..., 22-n1, 22-n2, 22-n3, 22-n4 of n groups amplifies data of each of four bit line pairs of n groups. Precharge circuits 30-1 and 30-2 precharge each of partial local data input/output line pairs P3ALI011/B and P3ALI013/B in response to a precharge signal AC1. Precharge circuits 30-5 and 30-6 precharge each of partial local data input/output line pairs P3ALI012/B and P3ALI014/B in response to a precharge signal AC12.

The function of partial blocks AMC17 and AMC18 and their peripheral block is the same as that of partial blocks AMC15 and AMC16 described above.

Partial local data input/output line pairs ALI011/B, ALI012/B, ALI013/B and ALI014/B are connected to global data input/output line pairs GI041/B, GI042/B, GI043/B and GI044/B, respectively. Precharge circuits 30-3 and 304 precharge two partial local data input/output line pairs P4ALI011/B and P4ALI013/B in response to a precharge signal AC1. Precharge circuits 30-7 and 30-8 precharge two partial local data input/output line pairs P4ALI012/B and P4ALI014/B in response to a precharge signal AC12.

The operation of a circuit shown in FIG. 3 is as follows. Four bit line pairs BL11 and BLB11, BLI2 and BLB12, BL13 and BLB13, BL14 and BLB14, ..., BLn1 and BLBn1, BLn2 and BLBn2, BLn3 and BLBn3, BLn4 and BLBn4 of n groups of each of two partial blocks AMC15 and AMC16, AMC17 and AMC18 of a memory cell array block ABLA are precharged by enabling bit line precharge circuits BPRE before a row address strobe signal is activated. At this time, bit line pairs of all memory cell array blocks ABLA, ABLB, ABLC, ABLD, BBLA, BBLB, BBLC and BBLD shown in FIG. 2 are precharged.

If a memory cell array bank BA and a memory cell array block ABLA are activated by applying a row address when applying a row address strobe instruction, bit line precharge circuits 24-11, 24-12, 24-13, 24-14, ..., 24-n1, 24-n2, 24-n3, 24-n4 are disabled. At this time, bit line precharge circuits of bit line pairs of other memory cell array blocks ABLB, ABLC, ABLD, BBLA, BBLB, BBLC and BBLD shown in FIG. 2 maintain the precharge operation.

Before a column address strobe signal is activated, local data input/output line precharge circuits 30-1, 30-2, 30-3, 304, 30-5, 30-6, 30-7 and 30-8 are enabled and precharge partial local data input/output line pairs P3ALI011/B, P3ALI013/B, P3ALI012/B and P3ALI014/B, and P4ALI011/B, P4ALI013/B, P4ALI042/B and P3ALI044/B. At this time, local data input/output line pairs ALI01/B, ALI012/B, ALI023/B, ALI034/B, ALI04/B, BLI01/B, BLI012/B, BLI023/B, BLI034/B and BLI04/B of memory cell array blocks ABLA, ABLB, ABLC, ABLD, BBLA, BBLB, BBLC and BBLD shown in FIG. 2 are precharged.

If a column address strobe signal is activated, precharge signals AC1 and AC2 are deactivated, and by disabling local data input/output line precharge circuits 30-1, 30-2, 30-3, 304, 30-5, 30-6, 30-7 and 30-8, the precharge operation of partial local data input/output line pairs P3ALI011/B, P3ALI013/B, P3ALI012/B and P3ALI014/B, and P4ALI011/B, P4ALI013/B, P4ALI042/B and P3ALI044/B ends. At this time, the precharge operation of local data input/output line pairs ALI01/B, ALI012/B, ALI023/B, ALI034/B, ALI04/B, BLI01/B, BLI012/B, BLI023/B, BLI034/B and BLI04/B of other memory cell array blocks ABLB, ABLC, ABLD, BBLA, BBLB, BBLC and BBLD shown in FIG. 2 is maintained.

When a column address strobe signal is activated and a column selection signal CSL1 is generated in response to a column address, column selection gates 22-11, 22-12, 22-13 and 22-14 of each of partial blocks AMC15 and AMC16, AMC17 and AMC18 are turned on and thus data is transmitted between four bit line pairs BL11/B, BL12/B, BL13/B and BL14/B and partial local data input/output line pairs P3ALI011/B, P3ALI013/B, P3ALI012/B and P3ALI014/B, and P4ALI011/B, P4ALI013/B, P4ALI042/ and, P3ALI044/ B. Also, column selection gates, not shown, of each of partial blocks AMC11 and AMC12, AMC13 and AMC14 shown in FIG. 2 are turned on and thus data are transmitted between four bit line pairs and partial local data input/output line pairs.

That is, 16 pairs of data are transmitted between four bit line pairs BL11 and BLB11, BL12 and BLB12, BL13 and BLB13, BL14 and BLB14 of each of four partial blocks AMC11, AMC13, AMC15 and AMC17 of a memory cell array block ABLA of a memory cell array bank BA and four partial local data input/output line pairs P3ALI011/B, P3ALI013/B, P3ALI012/B and P3ALI014/B, P4ALI011/B, P4ALI013/B, P4ALI042/B and P3ALI044/B shown in FIG. 2.

According to the above mentioned embodiment, the conventional semiconductor memory device having a stack bank structure is constructed such that each memory cell array block comprises a predetermined number of partial blocks and a predetermined number of data are input/output from each of the partial blocks. Thus, each of the local data input/output line pairs is separated into a predetermined number of separate partial local data input/output line pairs, and each of the separated partial local data input/output line pairs requires a local data line precharge circuit.

Figure 4:
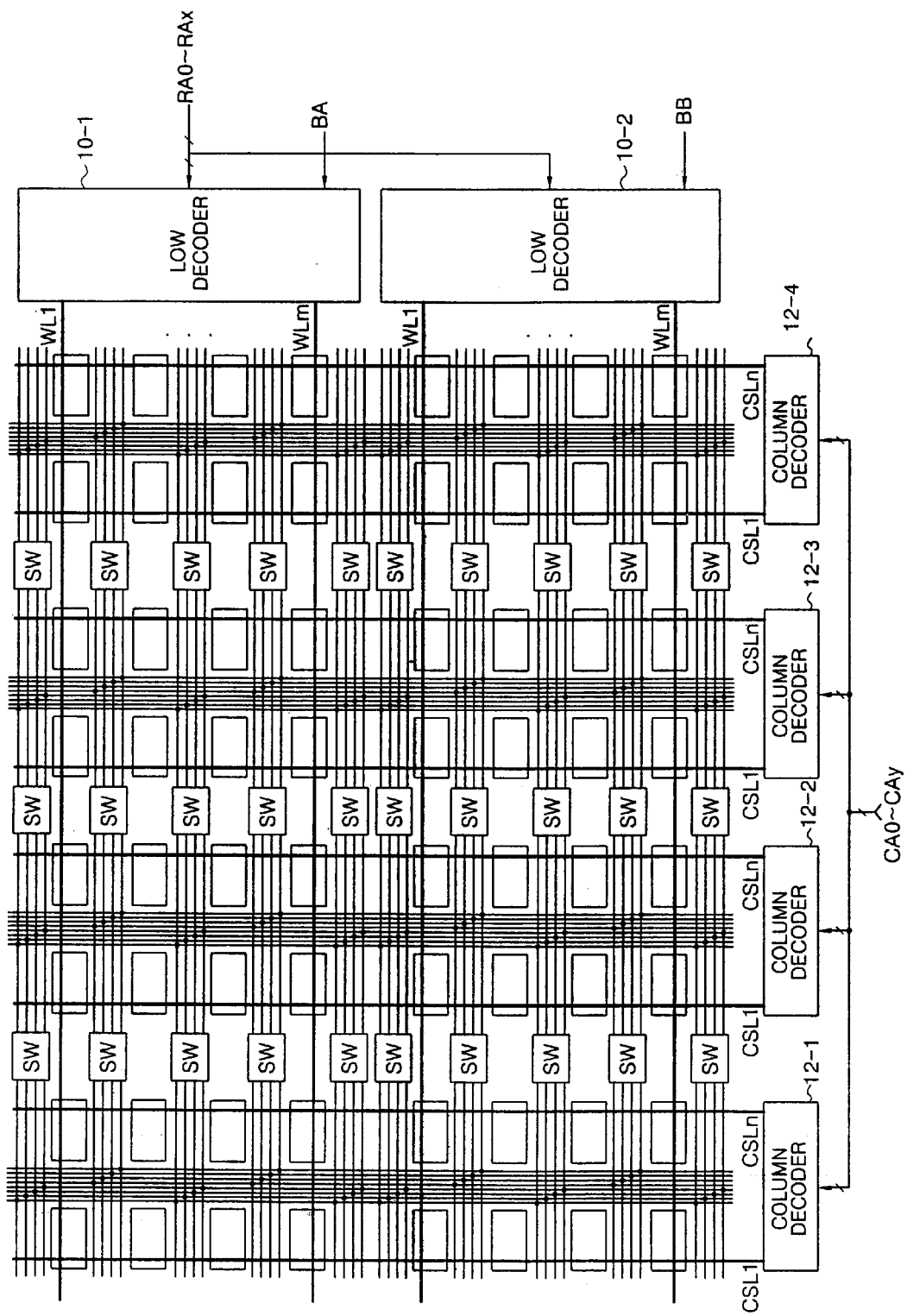
FIG. 4 is a detailed block diagram illustrating an embodiment of a semiconductor memory device having stack bank structure in accordance with the present invention.
Figure 5:
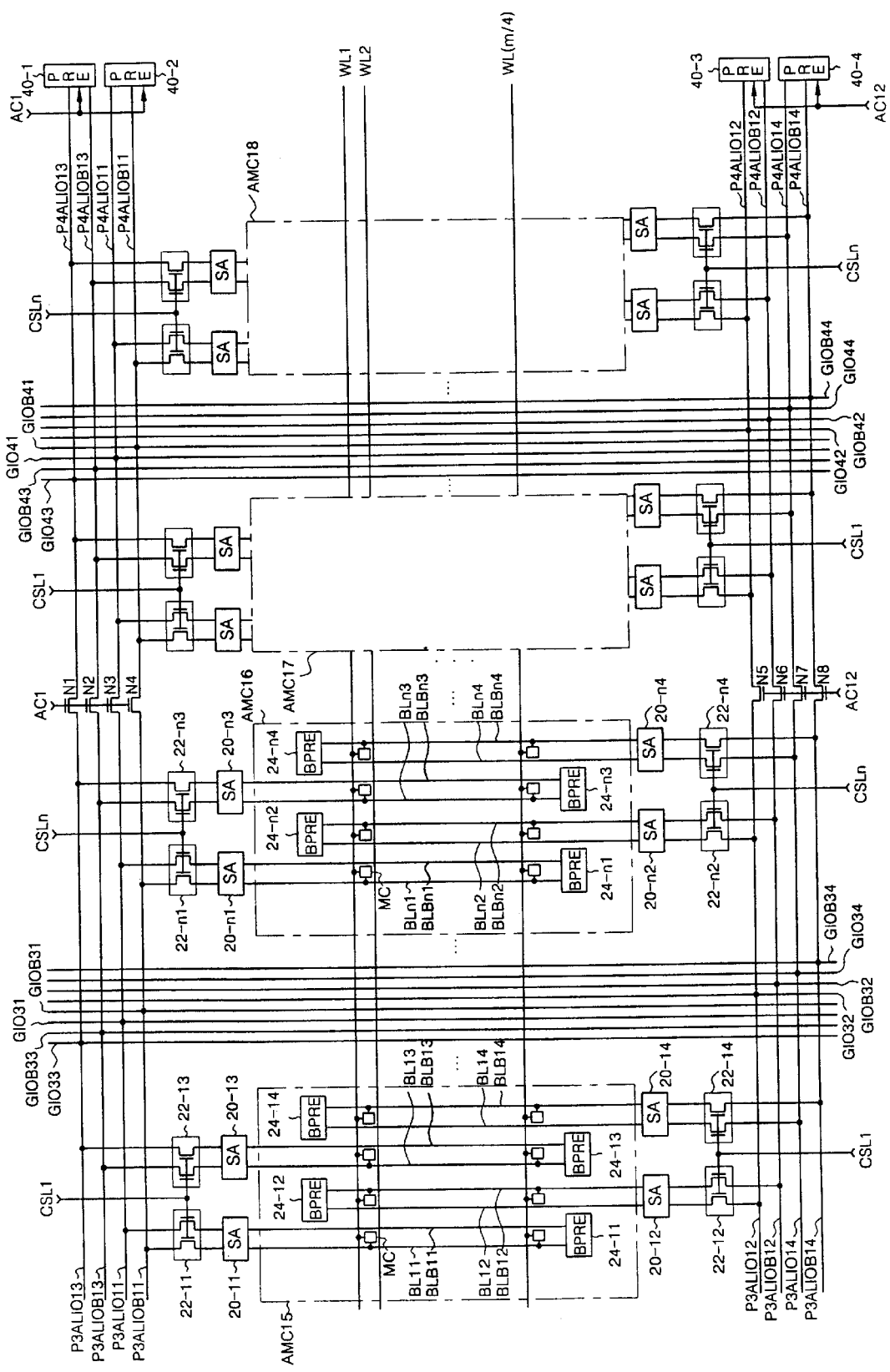
FIG. 5 is a close-up block diagram illustrating further details of the partial blocks of the memory cell array of FIG. 4, in accordance with the present invention.

FIG. 4 is a block diagram illustrating an embodiment of a semiconductor memory device according to the present invention. In the inventive configuration, the precharge circuits PRE of FIG. 2 positioned between separate partial local data input/output line pairs are eliminated. Instead, as shown in FIG. 5, a precharge circuit PRE is located on one side, for example the right side, of the local data input/output line pairs and switch circuits SW control the interconnection between separated partial local data input/output line pairs. Although the precharge circuit PRE corresponding to each of the local data input/output line pairs is shown in the right side in the embodiment of FIG. 5, the position of the precharge circuit PRE can be located anywhere along the corresponding local data input/output line pairs. Switch circuits SW are located between the separated partial local data input/output line pairs. In FIGS. 4 and 5, the symbols of each of the memory blocks and the data and address lines correspond to the symbols shown in FIG. 1.

A preferred precharge operation of the semiconductor device shown in FIG. 4 is as follows. When performing a precharge operation before a column address strobe signal is activated, all partial local data input/output line pairs are precharged by a single precharge circuit PRE by activating switch circuits SW to thereby connect partial local data input/output line pairs.

When a column address strobe signal is activated, the precharge circuit PRE of local data input/output line pairs of an activated memory cell array block is disabled, and switch circuits SW are turned off and the precharge operation ends.

That is, a semiconductor memory device shown in FIGS. 4 and 5 precharges local data input/output line pairs by connecting partial local data input/output line pairs via activated switches SW such that all line pairs are coupled to, and precharged by, a common enabled precharge circuit PRE. Conversely, when performing read or write operation after a precharge operation, the precharge circuit PRE is disabled, and the connection of partial local data input/output line pairs is disconnected by deactivating the switch circuits SW.

FIG. 5 is a detailed block diagram of partial blocks AMC15, AMC16, AMC17, AMC18 shown in FIG. 4. The four precharge circuits 30-1, 30-2, 30-3, 304, 305, 30-6, 30-7, 30-8 of FIG. 3 are eliminated. Instead, NMOS transistors N1, N2, N3, N4, N5, N6, N7, N8 operate as the switch SW of FIG. 4 to control the connection between partial local data input/output line pairs of partial blocks AMC15, AMC16 and partial blocks AMC17, AMC18 in response to precharge signals AC1, AC12, and precharge circuits 40-1, 40-2, 403, 404 to precharge each of partial local data input/output line pairs (P3ALI011/B, P3ALI013/B, P3ALI012/B, P3ALI014/B), (P4ALI011/B, P4ALI013/B, P4ALI042/B, P3ALI044/B) in response to each of precharge signals AC1, AC12.

A preferred precharge operation of the circuit shown in FIG. 5 is as follows. Assuming precharge signals AC1, AC12 at a "high" level are generated in performing a precharge operation, precharge circuits 40-1, 40-2, 40-3, 404 are enabled, and partial local data input/output line pairs (P3ALI011/B, P3ALI013/B, P3ALI012/B, P3ALI014/B), (P4ALI011/B, P4ALI013/B, P4ALI042/B, P3ALI044/B) are precharged by activating NMOS transistors N1, N2, N3, N4, N5, N6, N7, N8. Accordingly, all local data input/output line pairs shown in FIG. 4 are precharged.

Assuming precharge signals AC1, AC12 transition to a "low" level in performing a read or write operation as to a memory cell array block ABLA, precharge circuits 40-1, 40-2, 40-3, 40-4 are disabled, and NMOS transistors N1, N2, N3, N4, N5, N6, N7, N8 are deactivated. Thus, precharge circuits 40-1, 40-2, 40-3, 40-4 do not operate, and the connection of partial local data input/output line pairs (P3ALI011/B, P3ALI013/B, P3ALI012/B, P3ALI014/B3), P4ALI011/B, P4ALI013/B, P4ALI042/B, P3ALI044/B) is disabled. At this time, all connections of partial local data input/output line pairs of a memory cell array block ABLA shown in FIG. 4 are disconnected.

Unlike the precharge method of a conventional semiconductor memory device, which performs a precharge operation with physical separation of partial local data input/output line pairs, the precharge method of a semiconductor memory device of the present invention performs a precharge operation by selectively and temporarily connecting partial local data input/output line pairs electrically via switch circuits.

That is, a semiconductor memory device of the present invention performs a precharge operation by selective activation of switch circuits, thereby connecting partial local data input/output line pairs only during a precharge operation, and electrically disconnects the partial local data input/output line pairs by deactivating the switch circuits hen performing read or write operations.

Figure 6:
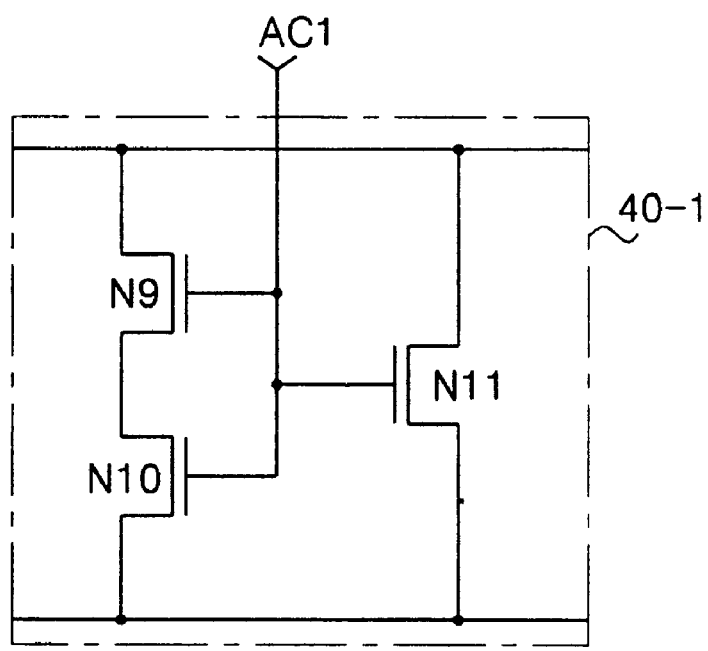
FIG. 6 is a circuit diagram of an embodiment of a precharge circuit of FIG. 5 in accordance with the present invention.

FIG. 6 is a circuit diagram of an embodiment of a precharge circuit 40-1 shown in FIG. 5, and comprises two NMOS transistors N9, N10 connected serially between local data line pairs 101A, 101B in response to a precharge signal AC1, and an NMOS transistor Nil connected between local data line pairs 101A, 101B in response to a precharge signal AC1.

The operation of the precharge circuit shown in FIG. 6 is as follows. If a precharge signal AC1 transitions to a "high" level, NMOS transistors N9, N10, N11 are turned on and local data input/output line pairs are precharged. Conversely, if a precharge signal AC1 transitions to a "low" level, NMOS transistors N9, N10, N11 are turned off and the precharge operation ends.

The comparison between the number of transistors comprised in precharge circuits of a conventional semiconductor memory device shown in FIG. 2 and the number of transistors comprised in a semiconductor memory device of the present invention is as follows.

In the exemplary conventional semiconductor memory device shown in FIG. 2, 80 precharge circuits are required, and assuming each precharge circuit comprises 3 NMOS transistors as shown in FIG. 6, the total number of 240 NMOS transistors are required. In a comparatively sized semiconductor memory device of the present invention, since 20 precharge circuits and 30 switch circuits are needed, a total number of 180 NMOS transistors are required, thereby reducing the number of NMOS transistors required for precharge.

Additionally, since the location where conventional precharge circuits are arranged is typically in a region of the chip where other circuit blocks are located, a reduction of the number of transistors in this area is important.

While this invention has been particularly shown and described with reference to preferred embodiments thereof, it will be understood by those skilled in the art that various changes in form and detail may be made herein without departing from the spirit and scope of the invention as defined by the appended claims.

What is claimed is:

1. A semiconductor memory device comprising;
    a plurality of memory cell array banks, each memory cell bank being partitioned into a plurality of memory cell array blocks, each memory cell array block comprising a predetermined number of partial blocks connected respectively to a predetermined number of groups of a plurality of partial local data input/output line pairs, the local data input/output line pairs being in turn connected respectively to a predetermined number of groups of a plurality of global data input/output line pairs;
    a plurality of switching means which connected respectively between said predetermined number of groups of the plurality of partial local data input/output line pairs, the switches being activated in response to a precharge signal for connecting said predetermined number of groups of the plurality of partial local data input/output line pairs; and
    a predetermined number of precharge means to precharge said predetermined number of groups of the plurality of partial local data input/output line pairs of each memory cell array block in response to said precharge signal.

2. A semiconductor memory device according to claim 1, wherein each of the plurality of switching means comprises a first NMOS transistor which is turned on in response to the above precharge signal.

3. A semiconductor memory device according to claim 1, wherein each of precharge means comprises;
    second and a third NMOS transistors which are connected serially between said partial local data input/output line pairs, and which are turned on in response to said precharge signal; and
    a fourth NMOS transistor which is connected between said partial local data input/output line pairs, and which is turned on in response to said precharge signal.

4. A method of precharging a semiconductor memory device comprising:

partitioning a plurality of memory cell array banks into a plurality of memory cell array blocks, each memory cell array block comprising a predetermined number of partial blocks connected respectively to a predetermined number of groups of a plurality of partial local data input/output line pairs, the local data input/output line pairs being in turn connected respectively to a predetermined number of groups of a plurality of global data input/output line pairs;

connecting the predetermined number of groups of the plurality of partial local data input/output line pairs with a plurality of switching means, the switches being activated in response to a precharge signal for connecting said predetermined number of groups of the plurality of partial local data input/output line pairs; and precharging said predetermined number of groups of the plurality of partial local data input/output line pairs of each memory cell array block with a predetermined number of precharge means in response to said precharge signal.

5. The method according to claim 4, wherein each of the plurality of switching means comprises a first NMOS transistor which is turned on in response to said precharge signal.

6. The method according to claim 4, wherein each of precharge means comprises;

second and a third NMOS transistors which are connected serially between said partial local data input/output line pairs, and which are turned on in response to said precharge signal; and a fourth NMOS transistor which is connected between said partial local data input/output line pairs, and which is turned on in response to said precharge signal.

* * * * *